US012072289B2

(12) United States Patent
Nakamura

(10) Patent No.: US 12,072,289 B2
(45) Date of Patent: Aug. 27, 2024

(54) INSPECTION APPARATUS COMPRISING A FIRST IMAGER IMAGING FLUORESCENCE HAVING A WAVELENGTH LONGER THAN A FIRST WAVELENGTH AND A SECOND IMAGER IMAGING FLUORESCENCE HAVING A WAVELENGTH SHORTER THAN A SECOND WAVELENGTH AND INSPECTION METHOD

(71) Applicant: HAMAMATSU PHOTONICS K.K., Hamamatsu (JP)

(72) Inventor: Tomonori Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 257 days.

(21) Appl. No.: 17/442,158

(22) PCT Filed: Jan. 29, 2020

(86) PCT No.: PCT/JP2020/003248
§ 371 (c)(1),
(2) Date: Sep. 23, 2021

(87) PCT Pub. No.: WO2020/195136
PCT Pub. Date: Oct. 1, 2020

(65) Prior Publication Data
US 2022/0178837 A1  Jun. 9, 2022

(30) Foreign Application Priority Data
Mar. 28, 2019  (JP) .................................. 2019-062971

(51) Int. Cl.
*G01N 21/64* (2006.01)
*G01N 21/62* (2006.01)
(Continued)

(52) U.S. Cl.
CPC ......... *G01N 21/6456* (2013.01); *G01N 21/62* (2013.01); *G01N 21/63* (2013.01);
(Continued)

(58) Field of Classification Search
CPC ........... G01N 21/01; G01N 2021/0106; G01N 2021/0112; G01N 21/17; G01N 21/19;
(Continued)

(56) References Cited

U.S. PATENT DOCUMENTS 8,604,447 B2 * 12/2013 Young ................ G01N 21/9501
250/459.1
9,163,987 B2 * 10/2015 Sappey ................ G01J 3/4412
(Continued)

FOREIGN PATENT DOCUMENTS

CN  101542233 A  9/2009
CN  103654730 A  3/2014
(Continued)

OTHER PUBLICATIONS

International Preliminary Report on Patentability mailed Oct. 7, 2021 for PCT/JP2020/003248.

*Primary Examiner* — Allen C. Ho
(74) *Attorney, Agent, or Firm* — Faegre Drinker Biddle & Reath LLP

(57) ABSTRACT

An inspection apparatus is an inspection apparatus for inspecting a sample on which a plurality of light-emitting elements is formed, and includes an excitation light source that generates excitation light to irradiate the sample, a camera that images fluorescence having a wavelength longer than a reference wavelength in fluorescence from the light-emitting elements, and a control apparatus that determines a quality of each of the light-emitting elements based on fluorescence imaged by the camera, in which the reference wavelength is a wavelength obtained by adding a full width
(Continued)

Legend
1: inspection apparatus
20: excitation light source
60: dichroic mirror (optical element)
81: camera (first imaging unit)
82: camera (second imaging unit)
100: control apparatus (determining unit)

at half maximum of a normal fluorescence spectrum of the light-emitting element to a peak wavelength of the normal fluorescence spectrum.

17 Claims, 7 Drawing Sheets

(51) Int. Cl.
  *G01N 21/63* (2006.01)
  *G01N 21/88* (2006.01)
  *G01N 21/95* (2006.01)
  *G01N 21/01* (2006.01)

(52) U.S. Cl.
  CPC ......... *G01N 21/64* (2013.01); *G01N 21/6458* (2013.01); *G01N 21/6489* (2013.01); *G01N 21/8806* (2013.01); *G01N 21/8851* (2013.01); *G01N 21/9501* (2013.01); *G01N 21/9505* (2013.01); *G01N 2021/0112* (2013.01); *G01N 2021/6421* (2013.01); *G01N 2021/6463* (2013.01); *G01N 2021/6484* (2013.01); *G01N 2021/8845* (2013.01)

(58) Field of Classification Search
  CPC ........ G01N 21/25; G01N 21/62; G01N 21/63; G01N 21/64; G01N 2021/6421; G01N 21/6456; G01N 21/6458; G01N 2021/6463; G01N 2021/6484; G01N 21/6489; G01N 21/88; G01N 21/8806; G01N 2021/8845; G01N 21/8851; G01N 21/9501; G01N 21/9505

USPC .................................................. 250/330, 332
  See application file for complete search history.

(56) References Cited

U.S. PATENT DOCUMENTS

| | | | |
|---|---|---|---|
| 9,395,406 B2* | 7/2016 | Abe | ....................... H01L 33/005 |
| 9,546,956 B2* | 1/2017 | Abe | .................... G01N 21/9501 |
| 9,638,741 B2 | 5/2017 | Boeykens et al. | |
| 10,656,401 B2* | 5/2020 | Mori | .................. G01N 21/6486 |
| 11,340,163 B2* | 5/2022 | Ito | ........................... G01N 21/64 |
| 11,662,316 B2* | 5/2023 | Tatsuta | ............... G02B 27/1006 |
| | | | 250/458.1 |
| 11,694,324 B2* | 7/2023 | Nakamura | ............. G01N 21/95 |
| | | | 348/93 |
| 2012/0049085 A1 | 3/2012 | Sappey et al. | |
| 2013/0048873 A1 | 2/2013 | Young et al. | |
| 2014/0234994 A1 | 8/2014 | Abe | |

FOREIGN PATENT DOCUMENTS

| | | |
|---|---|---|
| CN | 107782742 A | 3/2018 |
| GB | 2231958 A | 11/1990 |
| JP | S63-250835 A | 10/1988 |
| JP | 2010-118668 A | 5/2010 |
| JP | 2014-163857 A | 9/2014 |
| JP | 2015-010834 A | 1/2015 |
| JP | 2018-132308 A | 8/2018 |
| TW | 201303286 A | 1/2013 |
| TW | 201728903 A | 8/2017 |

* cited by examiner

Legend
1: inspection apparatus
20: excitation light source
60: dichroic mirror (optical element)
81: camera (first imaging unit)
82: camera (second imaging unit)
100: control apparatus (determining unit)

Legend
1A: inspection apparatus
20: excitation light source
81: camera (first imaging unit)
100: control apparatus (determining unit)

INSPECTION APPARATUS COMPRISING A FIRST IMAGER IMAGING FLUORESCENCE HAVING A WAVELENGTH LONGER THAN A FIRST WAVELENGTH AND A SECOND IMAGER IMAGING FLUORESCENCE HAVING A WAVELENGTH SHORTER THAN A SECOND WAVELENGTH AND INSPECTION METHOD

TECHNICAL FIELD

An aspect of the present invention relates to an inspection apparatus and an inspection method.

BACKGROUND ART

As a method for determining the quality of a light-emitting element group formed on a wafer, there has been a known method of observing the photoluminescence emitted by a light-emitting element and determining the quality of the light-emitting element based on a luminance of the photoluminescence (for example, see Patent Literature 1).

In the inspection method described in Patent Literature 1, fluorescence from the light-emitting element is divided, fluorescence of different wavelengths is imaged by each of a plurality of cameras, and an estimated wavelength of light emitted from an observation target part is calculated based on a ratio of each observation luminance value.

CITATION LIST

Patent Literature

Patent Literature 1: Japanese Unexamined Patent Publication No. 2015-10834

SUMMARY OF INVENTION

Technical Problem

Here, the inspection method described in Patent Literature 1 focuses only on fluorescence of a normal emission spectrum. However, some light-emitting elements may have spots that emit light at longer wavelengths than the normal emission spectrum. In the above-mentioned inspection method, the quality of the light-emitting element may not be determined in consideration of the fluorescence on the long wavelength side, and the quality of the light-emitting element may not be determined with high accuracy.

An aspect of the invention has been made in view of the above circumstances, and an object of the invention is to determine the quality of a light-emitting element with high accuracy.

Solution to Problem

An inspection apparatus according to an aspect of the invention is an inspection apparatus for inspecting an object on which a plurality of light-emitting elements is formed, the inspection apparatus including an excitation light source that generates excitation light to irradiate the object, a first imaging unit that images fluorescence having a wavelength longer than a first wavelength in fluorescence from the light-emitting elements, and a determining unit that determines a quality of each of the light-emitting elements based on a first fluorescence image acquired by the first imaging unit, in which the first wavelength is a wavelength obtained by adding a full width at half maximum of a normal fluorescence spectrum of the light-emitting element to a peak wavelength of the normal fluorescence spectrum.

With the inspection apparatus according to the aspect of the invention, the quality of each of the light-emitting elements is determined based on a fluorescence image having a wavelength obtained by adding a full width at half maximum of a normal fluorescence spectrum of the light-emitting element to a peak wavelength of the normal fluorescence spectrum, that is, a fluorescence image on a long wavelength side that cannot be included in a normal fluorescence spectrum of the light-emitting element. Some light-emitting elements may have spots that emit light at longer wavelengths than the normal emission spectrum. However, when the quality of the light-emitting element is determined based on such a fluorescence image on the long wavelength side, it is possible to appropriately detect the fluorescence spot on the long wavelength side, and to appropriately determine that a light-emitting element having the fluorescence spot is defective. That is, with the inspection apparatus according to the aspect of the invention, the quality of the light-emitting element can be determined with high accuracy by considering the fluorescence on the long wavelength side.

The inspection apparatus may further include an optical element that separates fluorescence from the light-emitting elements into fluorescence having a wavelength longer than the first wavelength and fluorescence having a wavelength shorter than a second wavelength, and a second imaging unit that images fluorescence having a wavelength shorter than the second wavelength, the fluorescence having a wavelength included in a normal fluorescence spectrum of the light-emitting element. According to such a configuration, both the fluorescence on the long wavelength side and the fluorescence having the wavelength included in the normal fluorescence spectrum are imaged without time loss. In this way, not only abnormal light emission on the long wavelength side but also light emission in the normal fluorescence spectrum can be appropriately detected for each light-emitting element, and a light emission state of each light-emitting element can be acquired in more detail.

The first wavelength and the second wavelength may be the same wavelength, and the optical element may be a dichroic mirror. According to such a configuration, it is possible to easily and reliably image the fluorescence on the long wavelength side and the fluorescence having the wavelength included in the normal fluorescence spectrum described above.

The determining unit may determine a quality of each of the light-emitting elements based on the first fluorescence image and a second fluorescence image acquired by the second imaging unit. In this way, in addition to determining the quality of the light-emitting element in consideration of the fluorescence on the long wavelength side, it is possible to determine the quality of the light-emitting element based on the fluorescence having the wavelength included in the normal fluorescence spectrum. In this way, it is possible to determine the quality of the light-emitting element with higher accuracy in consideration of both the abnormality (fluorescence spot) on the long wavelength side and the light emission state in the normal fluorescence spectrum.

The determining unit may determine a quality of each of the light-emitting elements based on the second fluorescence image, and determine a quality based on the first fluorescence image for a light-emitting element determined to be non-defective in the determination after the determination. According to such a configuration, after a light-emitting element whose light emission state in the normal fluorescence spectrum is abnormal is appropriately determined to be defective, it is possible to further determine that a light-emitting element, which has an abnormality (fluorescence spot) on the long wavelength side even though a light emission state in the normal fluorescence spectrum is normal, is defective, and it is possible to identify a defective light-emitting element without omission in consideration of both the light emission state on the long wavelength side and the light emission state in the normal fluorescence spectrum. Further, since quality determination based on the first fluorescence image is performed only for a light-emitting element determined to be non-defective in quality determination based on the second fluorescence image, it is possible to shorten a time required for determination related to an abnormality on the long wavelength side.

The determining unit may determine a quality of each of the light-emitting elements based on the second fluorescence image, and determine a quality based on the first fluorescence image for a light-emitting element determined to be defective in the determination after the determination. According to such a configuration, for example, even when a light-emitting element is determined to be defective based on the light emission state in the normal fluorescence spectrum, if the light-emitting element has no abnormality (fluorescence spot) on the long wavelength side, the light-emitting element can be determined to be non-defective, and it is possible to prevent a light-emitting element not having a serious abnormality (fluorescence spot on the long wavelength side) from being determined to be defective. Further, since the quality determination based on the first fluorescence image is performed only for a light-emitting element determined to be defective in the quality determination based on the second fluorescence image, it is possible to shorten a time required for determination related to an abnormality on the long wavelength side.

The determining unit may determine a quality of each of the light-emitting elements based on a luminance of the second fluorescence image, and determine a quality of each of the light-emitting elements based on a bright spot contained in the first fluorescence image. According to such a configuration, the quality of the light-emitting element can be determined with higher accuracy in consideration of the luminance of the fluorescence in the normal fluorescence spectrum and information about the fluorescence spot on the long wavelength side (presence or absence and the number of abnormal fluorescence spots, etc.).

The determining unit may output a quality determination result of each of the light-emitting elements. In this way, it is possible to identify a light-emitting element that affects the light emission efficiency and take measures to improve the light emission efficiency by using the quality determination result for each light-emitting element.

The determining unit may identify a defective portion in the light-emitting elements, and output a position of the defective portion. For example, when a position of a fluorescence spot on the long wavelength side is identified based on an imaging result, and the position of the fluorescence spot is output as a defective portion, it is possible to take measures to improve the light emission efficiency based on information about the defective portion.

An inspection method according to an aspect of the invention is an inspection method of inspecting an object on which a plurality of light-emitting elements is formed, the method including an excitation light irradiation step of irradiating the object with excitation light, a first imaging step of imaging fluorescence having a wavelength longer than a first wavelength in fluorescence from the light-emitting elements, and a determination step of determining a quality of each of the light-emitting elements based on a first fluorescence image acquired in the first imaging step, in which the first wavelength is a wavelength obtained by adding a full width at half maximum of a normal fluorescence spectrum of the light-emitting element to a peak wavelength of the normal fluorescence spectrum.

The inspection method may further include a separation step of separating fluorescence from the light-emitting elements into fluorescence having a wavelength longer than the first wavelength and fluorescence having a wavelength shorter than a second wavelength, and a second imaging step of imaging fluorescence having a wavelength shorter than the second wavelength, the fluorescence having a wavelength included in a normal fluorescence spectrum of the light-emitting element.

The first wavelength and the second wavelength may be the same wavelength.

In the determination step, a quality of each of the light-emitting elements may be determined based on the first fluorescence image and a second fluorescence image acquired in the second imaging step.

In the determination step, a quality of each of the light-emitting elements may be determined based on the second fluorescence image, and a quality may be determined based on the first fluorescence image for a light-emitting element determined to be non-defective in the determination after the determination.

In the determination step, a quality of each of the light-emitting elements may be determined based on the second fluorescence image, and a quality may be determined based on the first fluorescence image for a light-emitting element determined to be defective in the determination after the determination.

In the determination step, a quality of each of the light-emitting elements may be determined based on a luminance of the second fluorescence image, and a quality of each of the light-emitting elements may be determined based on a bright spot contained in the first fluorescence image.

In the determination step, a quality determination result of each of the light-emitting elements may be output.

In the determination step, a defective portion in the light-emitting elements may be identified, and a position of the defective portion may be output.

Advantageous Effects of Invention

According to an aspect of the invention, it is possible to determine the quality of a light-emitting element with high accuracy.

BRIEF DESCRIPTION OF DRAWINGS

FIG. 5 shows fluorescence images of a light-emitting element in an abnormal light emission state, in which FIG. 5(a) is a fluorescence image having an original emission wavelength, and FIG. 5(b) is a fluorescence image on a long wavelength side.

DESCRIPTION OF EMBODIMENTS

Hereinafter, an embodiment of the invention will be described in detail with reference to the drawings. Note that in each figure, the same reference symbols are assigned to the same or corresponding parts, and duplicate description will be omitted.

Figure 1:
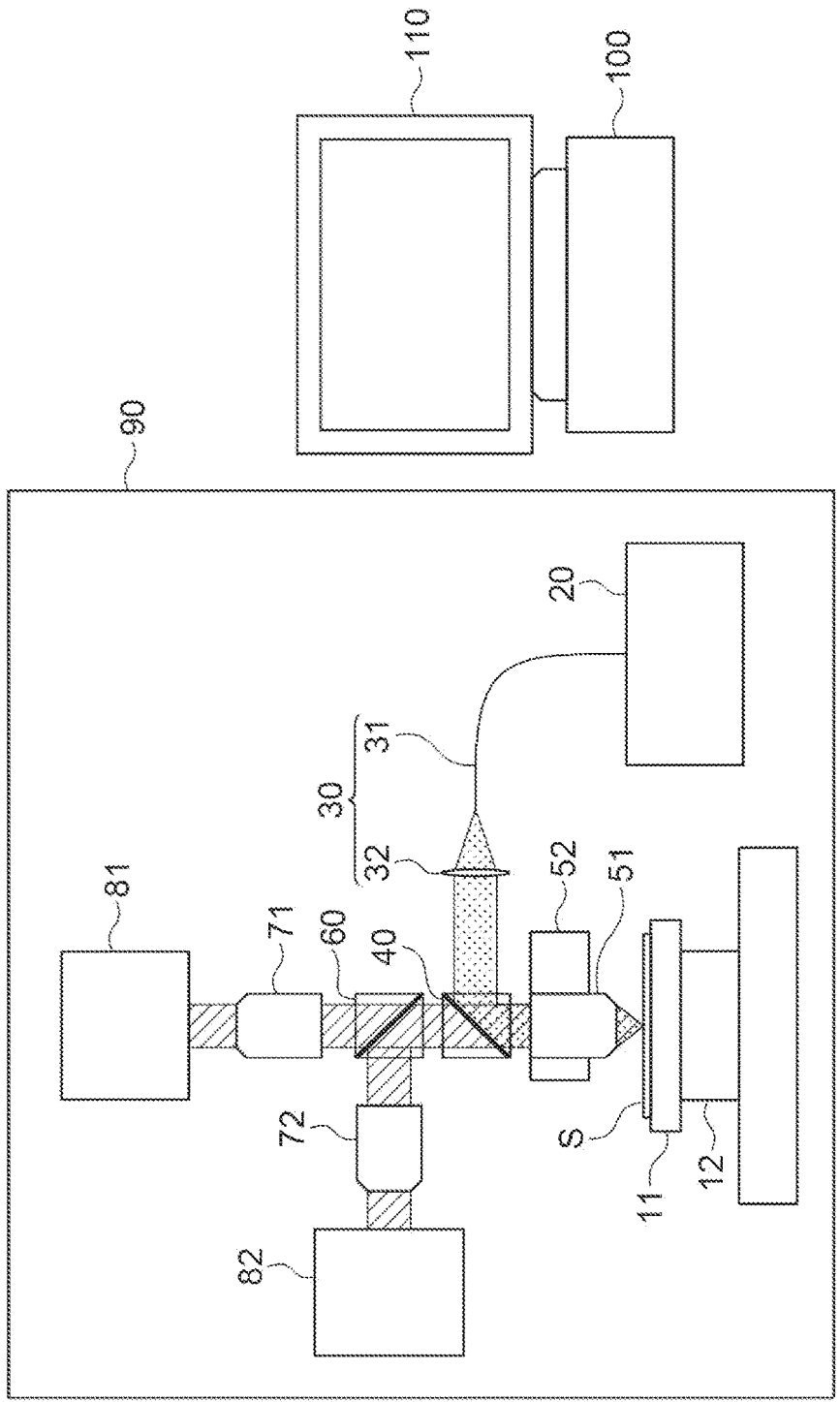
FIG. 1 is a configuration diagram of an inspection apparatus according to an embodiment of the invention.

FIG. 1 is a configuration diagram of an inspection apparatus 1 according to the present embodiment. The inspection apparatus 1 is a apparatus that inspects a sample S (object). For example, the sample S is a semiconductor apparatus in which a plurality of light-emitting elements is formed on a wafer. The light-emitting element is, for example, an LED, a mini LED, a µLED, an SLD element, a laser element, a vertical laser element (VCSEL), etc. The inspection apparatus 1 determines the quality of each light-emitting element by observing photoluminescence (specifically, fluorescence) of the plurality of light-emitting elements formed in the sample S. For example, it is possible to consider determining the quality of the light-emitting element by probing (that is, based on an electrical characteristic). However, for a fine LED such as a µLED, probing for performing measurement by applying a needle is physically difficult. In this regard, in the method for determining the quality of the light-emitting element based on photoluminescence according to the present embodiment, the quality of the light-emitting element can be determined by acquiring a fluorescence image, so that the qualities of a large number of light-emitting elements can be efficiently determined without being bound by physical restrictions.

As illustrated in FIG. 1, the inspection apparatus 1 includes a chuck 11, an XY stage 12, an excitation light source 20, an optical system 30, a dichroic mirror 40, an objective lens 51, a Z stage 52, a dichroic mirror 60 (optical element), imaging lenses 71 and 72, cameras 81 (first imaging unit) and 82 (second imaging unit), a dark box 90, a control apparatus 100 (determining unit), and a monitor 110. The dark box 90 accommodates components other than the control apparatus 100 and the monitor 110 among the components described above, and is provided to prevent an influence of external light on each of the accommodated components. Note that the respective components accommodated in the dark box 90 may be mounted on a vibration isolation table to improve the quality of images captured by the cameras 81 and 82 (improve the image quality and prevent image misalignment).

The chuck 11 is a holding member that holds the sample S. The chuck 11 holds the sample S by, for example, vacuum-sucking the wafer of the sample S. The XY stage 12 is a stage for moving the chuck 11 holding the sample S in an XY direction (front-back and right-left directions), that is, in a direction along a mounting surface of the sample S on the chuck 11. The XY stage 12 moves the chuck 11 in the XY direction so that each of the plurality of light-emitting elements is sequentially set as an irradiation region of excitation light according to control of the control apparatus 100. Note that the inspection apparatus 1 may further include a rotating stage (Θ stage, not illustrated). Such a rotating stage may be provided, for example, above the XY stage 12 and below the chuck 11, or may be provided integrally with the XY stage 12. The rotating stage is used to accurately align vertical and horizontal positions of the sample S. By providing the rotating stage, it is possible to shorten a time for alignment, etc. and to shorten a total time for data processing.

The excitation light source 20 is a light source that generates excitation light to irradiate the sample S and irradiates the sample S with excitation light. The excitation light source 20 may be a light source capable of generating light including a wavelength that excites the light-emitting element of the sample S, and is, for example, an LED, a laser, a halogen lamp, a mercury lamp, a D2 lamp, a plasma light source, etc. Note that the inspection apparatus 1 may further include a sensor that monitors the illumination luminance to keep a luminance of excitation light emitted from the excitation light source 20 constant.

The optical system 30 includes an optical fiber cable 31 and a light guide lens 32. The optical fiber cable 31 is an optical fiber cable for guiding light connected to the excitation light source 20. As the optical fiber cable 31, for example, a polarization preservation fiber, a single mode fiber, etc. can be used. The light guide lens 32 is, for example, a single or composite convex lens, and guides excitation light arriving through the optical fiber cable 31 in a direction of the dichroic mirror 40. Note that, to prevent a wavelength of excitation light emitted from the excitation light source 20 from changing over time, the inspection apparatus 1 may include a band-pass filter (not illustrated) between the excitation light source 20 and the dichroic mirror 40.

Figure 2:
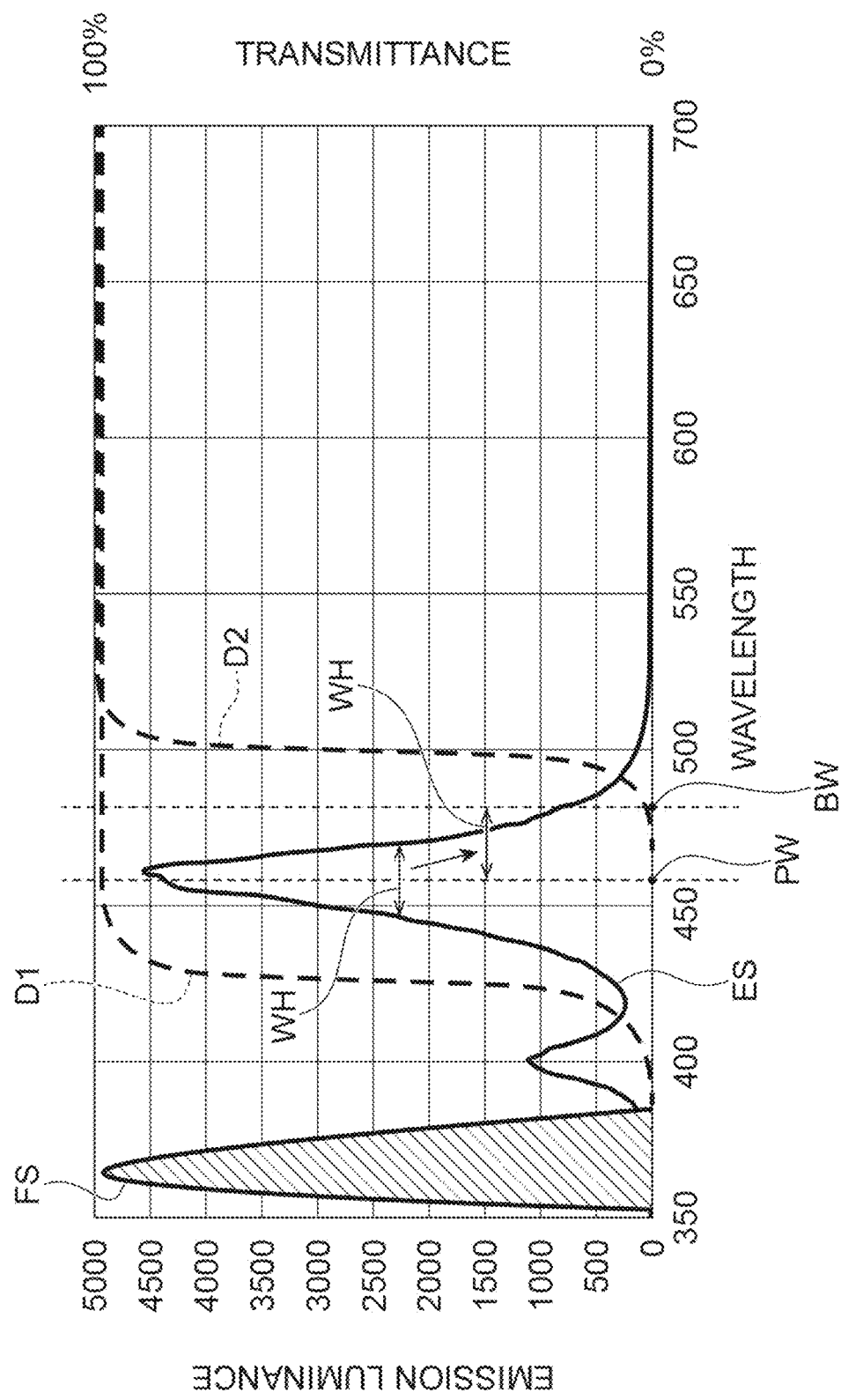
FIG. 2 is a diagram for description of an emission spectrum and characteristics of dichroic mirrors.

The dichroic mirror 40 is a mirror made of a special optical material, and reflects light of a specific wavelength and transmits light of other wavelengths. Specifically, the dichroic mirror 40 is configured to reflect excitation light in a direction of the objective lens 51 and transmit photoluminescence (specifically, fluorescence) from the light-emitting element, which is light in a wavelength band different from that of excitation light, in a direction of the dichroic mirror 60. Note that, as shown in FIG. 2, a region of a normal emission spectrum FS of excitation light is on a lower wavelength side of a region of a normal emission spectrum (normal fluorescence spectrum) ES of fluorescence. That is, the dichroic mirror 40 reflects excitation light, which is light in a low wavelength band, in the direction of the objective lens 51, and transmits fluorescence, which is light in a higher wavelength band than that of excitation light, in the direction of the dichroic mirror 60.

The objective lens 51 has a configuration for observing the sample S, and concentrates excitation light guided by the dichroic mirror 40 on the sample S. The Z stage 52 adjusts the focus by moving the objective lens 51 in a Z direction (vertical direction), that is, in a direction intersecting the mounting surface of the sample S on the chuck 11.

The dichroic mirror 60 is a mirror made of a special optical material, and reflects light of a specific wavelength and transmits light of other wavelengths. The dichroic mirror 60 separates fluorescence from the light-emitting element into fluorescence having a wavelength longer than a first wavelength and fluorescence having a wavelength shorter than a second wavelength. In the present embodiment, the first wavelength and the second wavelength will be described as being the same wavelength (reference wavelength BW). That is, the dichroic mirror 60 separates fluorescence from the light-emitting element into fluorescence having a wavelength longer than the reference wavelength BW and fluorescence having a wavelength shorter than the reference wavelength BW.

FIG. 2 is a diagram for description of an emission spectrum and characteristics of the dichroic mirrors 60 and 40. In FIG. 2, a horizontal axis represents a wavelength, a left vertical axis represents emission luminance, and a right vertical axis represents transmittance. As shown in FIG. 2, the above-mentioned reference wavelength BW is defined as a wavelength obtained by adding a full width at half maximum WH of a normal fluorescence spectrum ES of the light-emitting element to a peak wavelength PW of the normal fluorescence spectrum ES. Further, as is also clear from a characteristic D2 of the dichroic mirror 60 shown in FIG. 2, the dichroic mirror 60 is configured not to transmit (to reflect) fluorescence of a wavelength shorter than the reference wavelength BW and to transmit fluorescence of a wavelength longer than the reference wavelength BW. In addition, as is also clear from a characteristic D1 of the dichroic mirror 40 shown in FIG. 2, the dichroic mirror 40 reflects light in a wavelength band of the normal emission spectrum FS of the excitation light, and generally transmits light in a wavelength band of the normal fluorescence spectrum ES. As is clear from the characteristics D2 and D1 of the dichroic mirrors 60 and 40, fluorescence of a short wavelength reflected by the dichroic mirror 60 is fluorescence of a wavelength included in the normal fluorescence spectrum ES (fluorescence having an original emission wavelength), and fluorescence of a long wavelength transmitted by the dichroic mirror 60 is fluorescence of a wavelength not included in the normal fluorescence spectrum ES (fluorescence on a long wavelength side). Note that the original emission wavelength may be, for example, a wavelength known in advance from a specification of the light-emitting element, or may be a wavelength corresponding to a peak of intensity obtained by measuring fluorescence from the light-emitting element by a spectroscope.

Note that, specifically, it is considered that the dichroic mirror 60 transmits a part of fluorescence having a wavelength shorter than the reference wavelength BW and reflects a part of fluorescence having a wavelength longer than the reference wavelength BW (see FIG. 2). However, in general, the dichroic mirror 60 reflects fluorescence having a wavelength shorter than the reference wavelength BW and transmits fluorescence having a wavelength longer than the reference wavelength BW. Thus, hereinafter, a description will be given simply on the assumption that "the dichroic mirror 60 reflects fluorescence having a wavelength shorter than the reference wavelength BW and transmits fluorescence having a wavelength longer than the reference wavelength BW". Fluorescence having a wavelength longer than the reference wavelength BW (fluorescence on the long wavelength side) reaches the imaging lens 71 via the dichroic mirror 60. Fluorescence having a wavelength shorter than the reference wavelength BW (fluorescence having the original emission wavelength) reaches the imaging lens 72 via the dichroic mirror 60.

The imaging lens 71 is a lens that forms an image of fluorescence on the long wavelength side and guides the fluorescence to the camera 81. The camera 81 is an imaging unit that images fluorescence from the sample S. More specifically, the camera 81 images fluorescence having a wavelength longer than the reference wavelength BW (fluorescence on the long wavelength side) in fluorescence from the light-emitting element. The camera 81 images fluorescence on the long wavelength side by detecting the image formed by the imaging lens 71. The camera 81 outputs a fluorescence image on the long wavelength side, which is an imaging result, to the control apparatus 100. The camera 81 is, for example, an area image sensor such as a CCD or MOS. Further, the camera 81 may include a line sensor or a time delay integration (TDI) sensor. Note that the inspection apparatus 1 may further include a band-pass filter between the dichroic mirror 60 and the camera 81 to prevent unnecessary light emission on the long wavelength side.

The imaging lens 72 is a lens that forms an image of fluorescence having the original emission wavelength and guides the fluorescence to the camera 82. The camera 82 is an imaging unit that images fluorescence from the sample S. More specifically, the camera 82 images fluorescence, which has a wavelength shorter than the reference wavelength BW in fluorescence from the light-emitting element, having a wavelength included in the normal fluorescence spectrum ES (see FIG. 2) of the light-emitting element (fluorescence having the original emission wavelength). The camera 82 images fluorescence having the original emission wavelength by detecting the image formed by the imaging lens 72. The camera 82 outputs a fluorescence image having the original emission wavelength, which is an imaging result, to the control apparatus 100. The camera 82 is, for example, an area image sensor such as a CCD or MOS. Further, the camera 82 may include a line sensor or a TDI sensor. Note that the inspection apparatus 1 may further include a band-pass filter between the dichroic mirror 60 and the camera 82 to prevent fluorescence on the long wavelength side from being mixed due to surface reflection on the dichroic mirror 60 when measuring fluorescence on the short wavelength side.

The control apparatus 100 controls the XY stage 12, the excitation light source 20, the Z stage 52, and the cameras 81 and 82. Specifically, the control apparatus 100 adjusts an irradiation region of excitation light (irradiation region in the sample S) by controlling the XY stage 12. The control apparatus 100 adjusts the focus related to excitation light by controlling the Z stage 52. The control apparatus 100 adjusts emission of excitation light and adjusts a wavelength, amplitude, etc. of excitation light by controlling the excitation light source 20. The control apparatus 100 performs adjustment related to acquisition of a fluorescence image by controlling the cameras 81 and 82. Further, the control apparatus 100 determines the quality of the light-emitting element of the sample S based on fluorescence images captured by the cameras 81 and 82 (details will be described later). Note that the control apparatus 100 is a computer, and is physically configured to include a memory such as a RANI or a ROM, a processor (arithmetic circuit) such as a CPU, a communication interface, and a storage unit such as a hard disk. Examples of the control apparatus 100 include a personal computer, a cloud server, and a smart apparatus (smartphone, tablet terminal, etc.). The control apparatus 100 functions by executing a program stored in a memory on a CPU of a computer system. The monitor 110 is a display apparatus that displays a fluorescence image which is a measurement result.

Next, a detailed description will be given of a function of the control apparatus 100 related to determination of the quality of the light-emitting element.

The control apparatus 100 determines the quality of the light-emitting element based on a fluorescence image on the long wavelength side (first fluorescence image) acquired by the camera 81 and a fluorescence image having the original emission wavelength (second fluorescence image) acquired by the camera 82. The control apparatus 100 determines, for example, the quality of the light-emitting element based on the fluorescence image having the original emission wavelength acquired by the camera 82, and determines the quality of the light-emitting element determined to be non-defective in the determination based on the fluorescence image on the long wavelength side acquired by the camera 81 after the determination.

Figure 3:
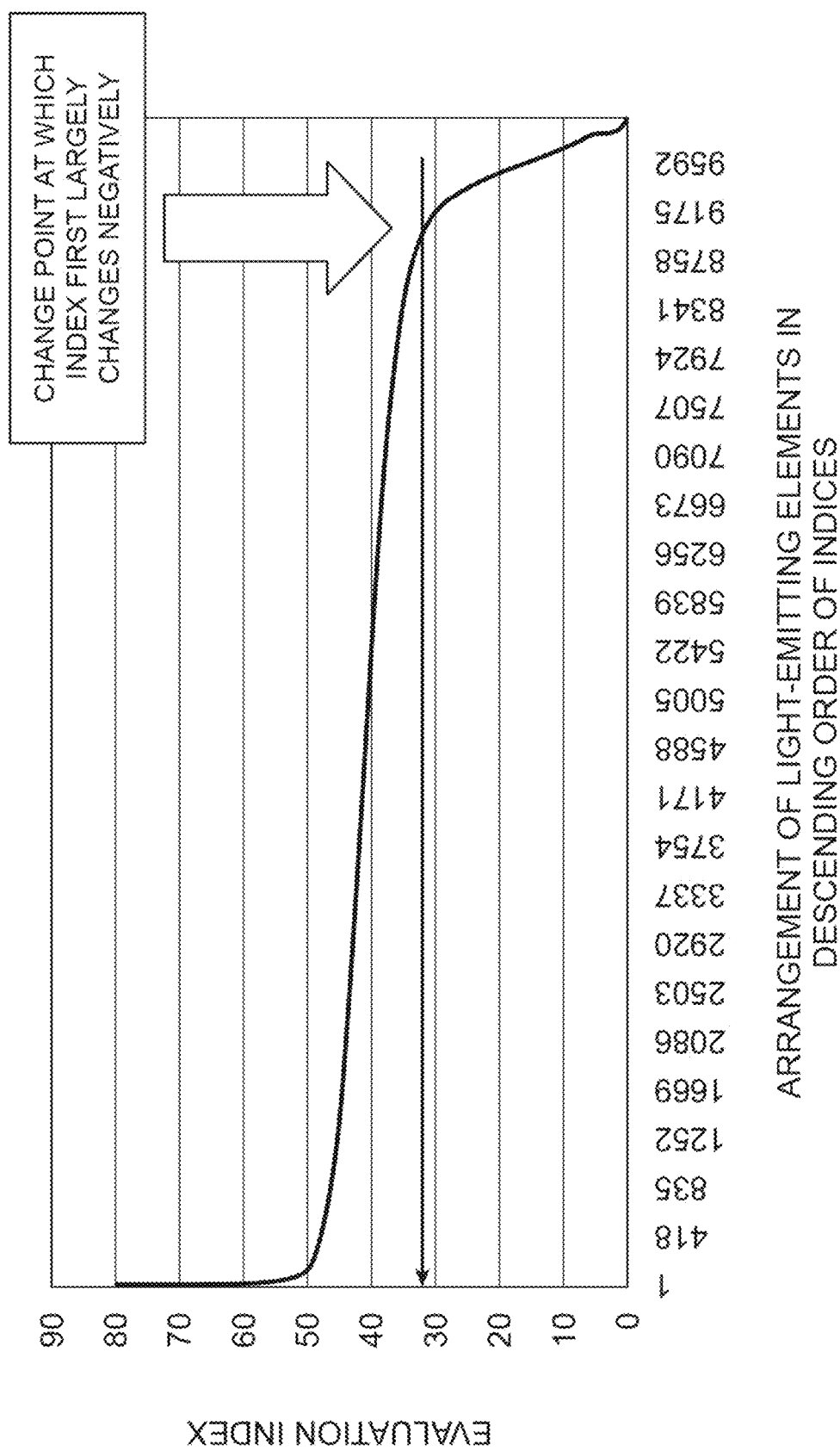
FIG. 3 is a diagram showing a sorting result for each light-emitting element according to an evaluation index.

The control apparatus 100 first identifies a position of the light-emitting element based on a fluorescence image, and identifies a light-emitting area of each light-emitting element. The position of the light-emitting element is identified, for example, by conversion between a position in the fluorescence image and a position of the XY stage 12. Note that the control apparatus 100 may acquire a pattern image of the entire sample S in advance and recognize (identify) the position of the light-emitting element from the pattern image or the fluorescence image. Then, the control apparatus 100 derives an average luminance in the light-emitting area of each light-emitting element based on the fluorescence image having the original emission wavelength, and associates an address position with a luminance (average luminance in the light-emitting area) for each light-emitting element. The control apparatus 100 derives an evaluation index from an absolute luminance and a relative luminance for each address (each light-emitting element). The relative luminance is a ratio of a luminance of a light-emitting element to be derived to an average luminance of a light-emitting element group including the light-emitting element to be derived and light-emitting elements around the light-emitting element. The control apparatus 100 derives the evaluation index from, for example, the product of the absolute luminance and the relative luminance. Alternatively, the control apparatus 100 derives the evaluation index from the product of the absolute luminance and the relative luminance to the nth power (n is a natural number, for example, 2). The control apparatus 100 derives the above-mentioned evaluation index for each of the light-emitting elements included in the same fluorescence image. Further, the control apparatus 100 acquires a new fluorescence image (a fluorescence image having the original emission wavelength) by changing the irradiation region, and derives an evaluation index for each light-emitting element included in the fluorescence image. When the control apparatus 100 derives the evaluation indices for all the light-emitting elements, the control apparatus 100 sorts (rearranges) the light-emitting elements in descending order of the evaluation indices. FIG. 3 is a diagram showing a sorting result for the light-emitting elements according to the evaluation indices. In FIG. 3, a vertical axis represents an evaluation index according to the magnitude of the luminance, and a horizontal axis represents the order of the respective light-emitting elements. As shown in FIG. 3, the evaluation index sharply decreases after a certain point (change point). For example, using such a change point as a threshold value, the control apparatus 100 may determine that a light-emitting element having an evaluation index equal to or higher than the threshold value is a non-defective product (non-defective pixel), and a light-emitting element having an evaluation index smaller than the threshold value is a defective product (defective pixel). Note that, for example, using a reference semiconductor apparatus for determining the threshold value in advance, the threshold value may be determined by comparing a quality determination result for a light-emitting element based on fluorescence (photoluminescence) with a quality determination result based on probing (quality determination result based on an electrical characteristic).

Further, the control apparatus 100 detects bright spots (fluorescence spots) in the light-emitting area of each light-emitting element based on the fluorescence image on the long wavelength side, and associates an address position with the number of bright spots for each light-emitting element. Such a bright spot (emission spot) on the long wavelength side of the normal emission spectrum is an abnormal emission point. Then, the control apparatus 100 determines whether or not the fluorescence image on the long wavelength side contains a certain number or more of bright spots for a light-emitting element determined to be non-defective in the quality determination based on the fluorescence image having the original emission wavelength described above, and determines that a light-emitting element not containing the certain number or more of bright spots is a non-defective product (non-defective pixel) and a light-emitting element containing the certain number or more of bright spots is a defective product (defective pixel). In such an example, a light-emitting element determined to be a non-defective product based on a fluorescence image having the original emission wavelength may be determined to be a defective product based on a fluorescence image on the long wavelength side.

Note that, after determining the quality of the light-emitting element based on the fluorescence image having the original emission wavelength acquired by the camera 82, the control apparatus 100 may determine the quality based on the fluorescence image on the long wavelength side acquired by the camera 81 for a light-emitting element determined to be defective by the determination. Further, the control apparatus 100 may determine the quality based on the fluorescence image on the long wavelength side for all the light-emitting elements. In this way, the control apparatus 100 may determine the quality based on the fluorescence image on the long wavelength side only for a light-emitting element determined to be non-defective based on the fluorescence image having the original emission wavelength, determine the quality based on the fluorescence image on the long wavelength side only for a light-emitting element determined to be defective based on the fluorescence image having the original emission wavelength, or determine the quality based on the fluorescence image on the long wavelength side for all the light-emitting elements regardless of the quality determination result based on the fluorescence image having the original emission wavelength.

The control apparatus 100 outputs the quality determination result for each light-emitting element. For example, the quality determination result is displayed on the monitor 110. Further, the control apparatus 100 may identify a defective portion (for example, a portion of a bright spot on the long wavelength side) in the light-emitting element, and output a position of the defective portion (so that the position is displayed on the monitor 110).

Figure 4:
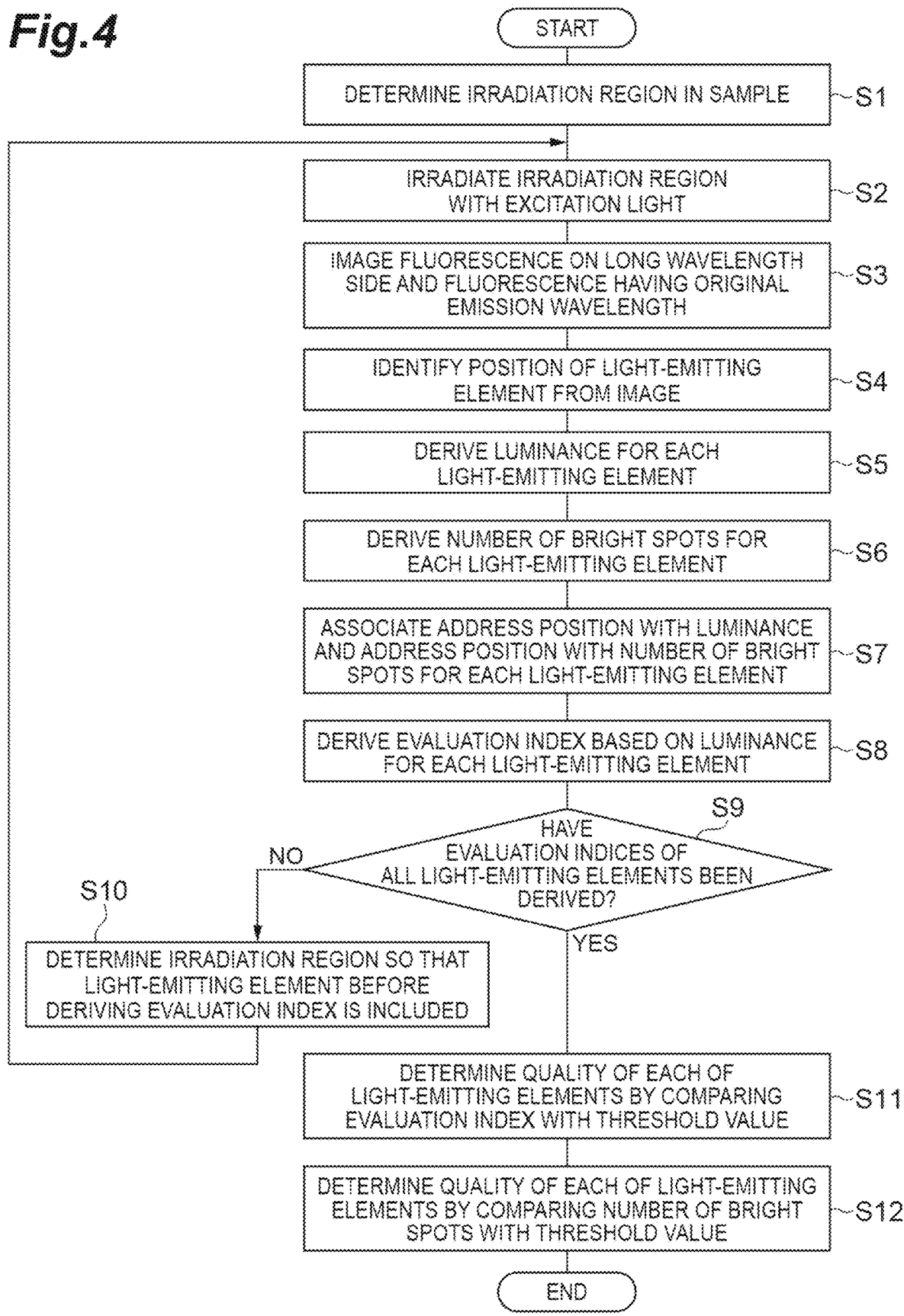
FIG. 4 is a flowchart of an inspection method executed by an inspection apparatus.

Next, a description will be given of a processing procedure of the inspection method (determination of the quality of the light-emitting element) executed by the inspection apparatus 1 with reference to FIG. 4. FIG. 4 is a flowchart of the inspection method executed by the inspection apparatus 1.

As illustrated in FIG. 4, in the inspection apparatus 1, the irradiation region in the sample S is first determined (step S1). Specifically, the control apparatus 100 determines the irradiation region for excitation light by controlling the XY stage 12.

Subsequently, the excitation light source 20 irradiates the irradiation region of the sample S with excitation light according to the control of the control apparatus 100 (step S2, excitation light irradiation step). The excitation light source 20 generates and emits light including a wavelength that excites the light-emitting element of the sample S. The excitation light reaches the dichroic mirror 40 via the optical fiber cable 31 and the light guide lens 32 of the optical system 30, is reflected by the dichroic mirror 40, and is concentrated on the irradiation region of the sample S via the objective lens 51. The light-emitting element of sample S emits fluorescence in response to excitation light. The fluorescence passes through the dichroic mirror 40 and is separated into fluorescence having the original emission wavelength and fluorescence on the long wavelength side in the dichroic mirror 60 (separation step). The fluorescence having the original emission wavelength forms an image by the imaging lens 72 and is guided to the camera 82. The fluorescence on the long wavelength side forms an image by the imaging lens 71 and is guided to the camera 81.

The camera 81 images the fluorescence on the long wavelength side (step S3, first imaging step). Further, the camera 82 images the fluorescence having the original emission wavelength (step S3, second imaging step). The cameras 81 and 82 output fluorescence images, which are imaging results, to the control apparatus 100.

Subsequently, the control apparatus 100 identifies the position of the light-emitting element based on the fluorescence images (step S4), and identifies the light-emitting area in each light-emitting element. Then, the control apparatus 100 derives a luminance (average luminance) in the light-emitting area of each light-emitting element based on the fluorescence image having the original emission wavelength (step S5). Further, the control apparatus 100 detects bright spots (fluorescence spots) in the light-emitting area of each light-emitting element based on the fluorescence image on the long wavelength side, and derives the number of bright spots (step S6). Then, the control apparatus 100 associates an address position with the luminance (average luminance) for each light-emitting element, and associates the address position with the number of bright spots (step S7).

Subsequently, the control apparatus 100 derives an evaluation index from an absolute luminance and a relative luminance for each light-emitting element (step S8). The control apparatus 100 derives an evaluation index from, for example, the product of the absolute luminance and the relative luminance. Alternatively, the control apparatus 100 derives an evaluation index from the product of the absolute luminance and the relative luminance to the nth power (n is a natural number, for example, 2).

Subsequently, the control apparatus 100 determines whether or not the above-mentioned evaluation index has been derived for all the light-emitting elements (light-emitting elements to be determined) of the sample S (step S9). When it is determined in step S9 that the evaluation index has not been derived, the control apparatus 100 determines a new irradiation region so that the light-emitting element before deriving the evaluation index is included (step S10). Thereafter, processing from step S2 is performed again.

When it is determined in step S9 that the evaluation index has been derived for all the light-emitting elements, the control apparatus 100 determines the quality of each of the light-emitting elements by comparing the evaluation index of each light-emitting element with a predetermined threshold value (step S11, determination step). Specifically, the control apparatus 100 sorts (rearranges) the light-emitting elements in descending order of the evaluation indices, and determines that a light-emitting element having an evaluation index equal to or higher than the threshold value is a non-defective product (non-defective pixel), and a light-emitting element having an evaluation index smaller than the threshold value is a defective product (defective pixel).

Finally, the control apparatus 100 determines the quality of each of the light-emitting elements by comparing the number of bright spots included in the fluorescence image on the long wavelength side with a predetermined threshold value (step S12, determination step). Specifically, the control apparatus 100 determines that a light-emitting element not containing a certain number or more of bright spots in the fluorescence image on the long wavelength side is a non-defective product (non-defective pixel), and a light-emitting element containing the certain number or more of bright spots is a defective product (defective pixel). The control apparatus 100 may output a quality determination result for each light-emitting element. Further, the control apparatus 100 may identify a defective portion (for example, a portion of a bright spot on the long wavelength side) in the light-emitting element and output a position of the defective portion (so that the position is displayed on the monitor 110).

Next, actions and effects of the present embodiment will be described.

The inspection apparatus 1 according to the present embodiment is an inspection apparatus for inspecting a sample S in which a plurality of light-emitting elements is formed, and includes an excitation light source 20 that generates excitation light to irradiate the sample S, a camera 81 that images fluorescence having a wavelength longer than a reference wavelength BW (see FIG. 2) in fluorescence from a light-emitting element, and a control apparatus 100 that determines the quality of the light-emitting element based on a fluorescence image (first fluorescence image) on the long wavelength side acquired by the camera 81, and the reference wavelength BW is a wavelength obtained by adding a full width at half maximum WH of a normal fluorescence spectrum ES of the light-emitting element to a peak wavelength PW of the normal fluorescence spectrum ES (see FIG. 2).

Figure 5:
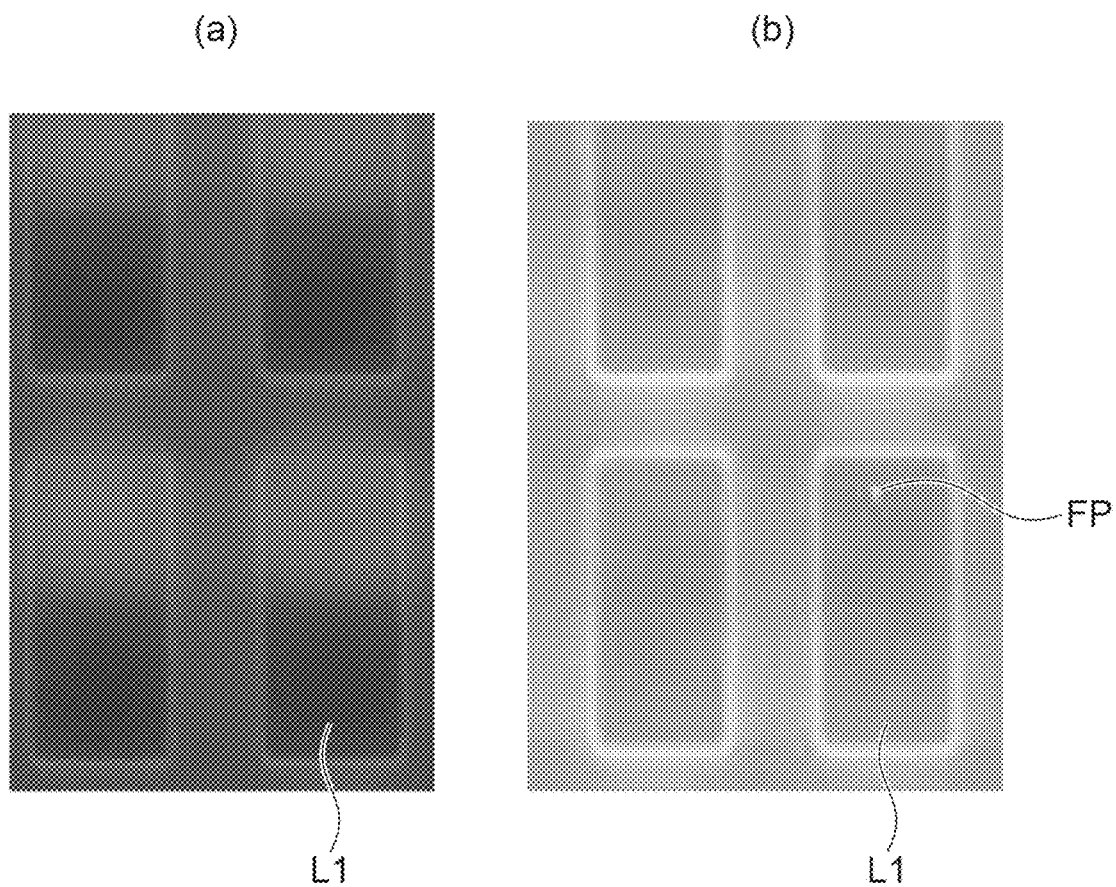
Figure 6:
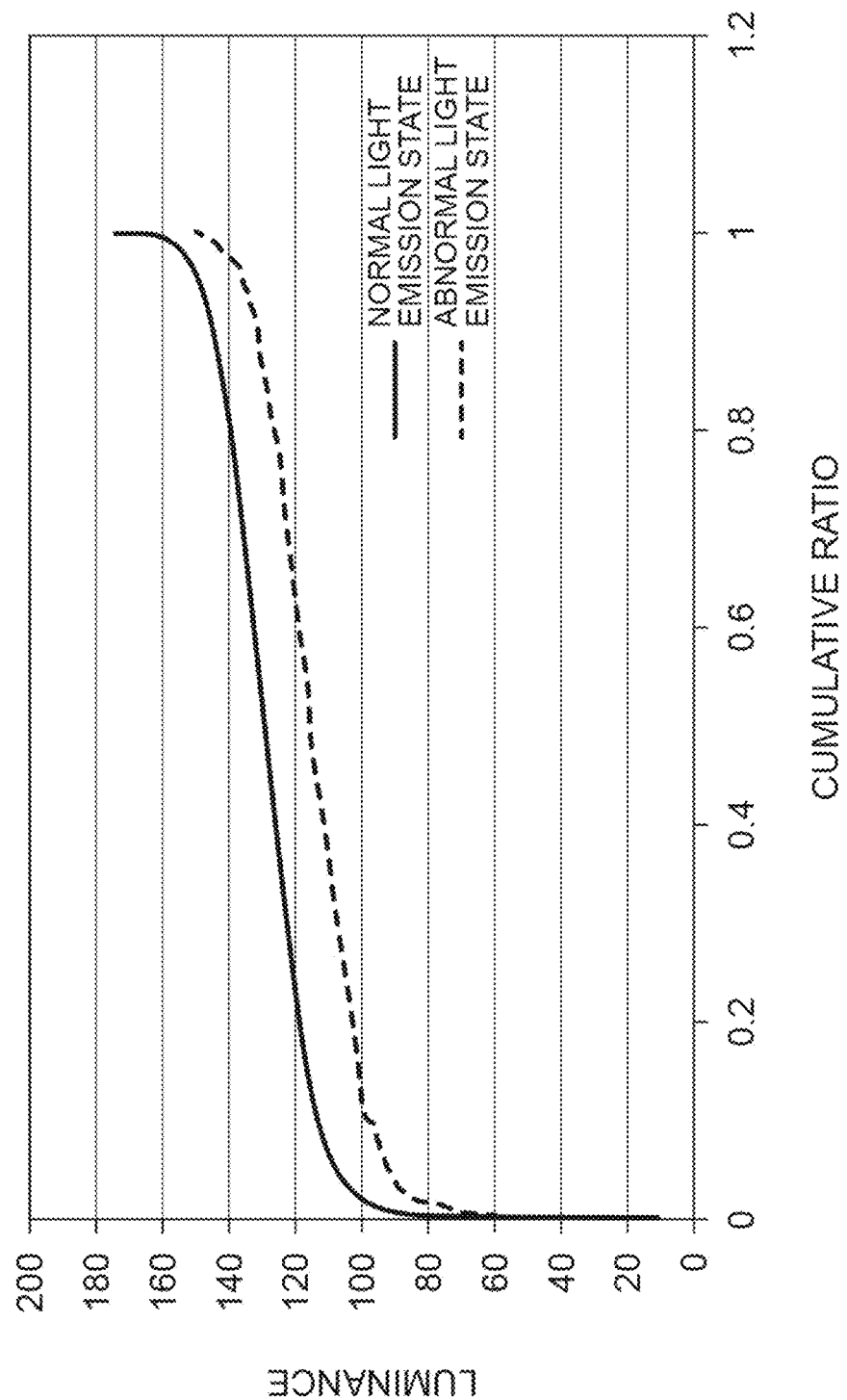
FIG. 6 is a diagram showing a luminance distribution in an abnormal light emission state and a luminance distribution in a normal light emission state.

According to the inspection apparatus 1, the quality of the light-emitting element is determined based on a fluorescence image having a wavelength obtained by adding the full width at half maximum WH of the normal fluorescence spectrum ES of the light-emitting element to the peak wavelength PW of the normal fluorescence spectrum ES, that is, a fluorescence image on the long wavelength side that cannot be included in the normal fluorescence spectrum ES of the light-emitting element. FIG. 5 shows fluorescence images of a light-emitting element L1 in an abnormal light emission state, in which FIG. 5(a) is a fluorescence image having an original emission wavelength, and FIG. 5(b) is a fluorescence image on a long wavelength side. As shown in FIG. 5(b), the light-emitting element L1 in the abnormal light emission state may have a fluorescence spot FP at longer wavelengths than the normal fluorescence spectrum. FIG. 6 is a diagram showing a luminance distribution of a light-emitting element in an abnormal light emission state and a luminance distribution of a light-emitting element in a normal light emission state. In FIG. 6, a vertical axis represents a luminance, and a horizontal axis represents a cumulative ratio. As shown in FIG. 6, a light-emitting element in an abnormal light emission state has a smaller luminance than that of a light-emitting element in a normal light emission state. As described above, a light-emitting element in an abnormal light emission state in which a fluorescence spot is generated on the long wavelength side has a small luminance, and thus needs to be determined to be a defective product. In this regard, as in the inspection apparatus 1 of the present embodiment, when the quality of the light-emitting element is determined based on a fluorescence image on the long wavelength side, it is possible to appropriately detect the fluorescence spot on the long wavelength side described above, and appropriately determine that a light-emitting element having the fluorescence spot is defective. That is, according to the inspection apparatus 1, by considering the fluorescence on the long wavelength side, it is possible to determine the quality of the light-emitting element with high accuracy.

The inspection apparatus 1 includes the dichroic mirror 60 that separates fluorescence from a light-emitting element into fluorescence on a long wavelength side and fluorescence having an original emission wavelength, and the camera 82 that images fluorescence, which has an original emission wavelength, having a wavelength included in a normal fluorescence spectrum of the light-emitting element. According to such a configuration, both the fluorescence on the long wavelength side and the fluorescence having the wavelength included in the normal fluorescence spectrum are imaged without time loss. In this way, not only abnormal light emission on the long wavelength side but also light emission in the normal fluorescence spectrum can be appropriately detected for each light-emitting element, and a light emission state of each light-emitting element can be acquired in more detail. Further, by separating the fluorescence using the dichroic mirror 60, it is possible to easily and reliably image the fluorescence on the long wavelength side and the fluorescence having the wavelength included in the normal fluorescence spectrum described above.

The control apparatus 100 determines the quality of the light-emitting element based on the fluorescence image on the long wavelength side and the fluorescence image having the original emission wavelength (second fluorescence image) acquired by the camera 82. In this way, in addition to determining the quality of the light-emitting element in consideration of the fluorescence on the long wavelength side, it is possible to determine the quality of the light-emitting element based on the fluorescence having the wavelength included in the normal fluorescence spectrum. In this way, it is possible to determine the quality of the light-emitting element with higher accuracy in consideration of both the abnormality (fluorescence spot) on the long wavelength side and the light emission state in the normal fluorescence spectrum.

The control apparatus 100 may determine the quality of the light-emitting element based on the fluorescence image having the original emission wavelength, and determine the quality based on the fluorescence image on the long wavelength side for a light-emitting element determined to be non-defective in the determination after the determination. According to such a configuration, after a light-emitting element whose light emission state in the normal fluorescence spectrum is abnormal is appropriately determined to be defective, it is possible to further determine that a light-emitting element, which has an abnormality (fluorescence spot) on the long wavelength side even though a light emission state in the normal fluorescence spectrum is normal, is defective, and it is possible to identify a defective light-emitting element without omission in consideration of both the light emission state on the long wavelength side and the light emission state in the normal fluorescence spectrum. Further, since quality determination based on the fluorescence image on the long wavelength side is performed only for a light-emitting element determined to be non-defective in quality determination based on the fluorescence image having the original emission wavelength, it is possible to shorten a time required for determination related to an abnormality on the long wavelength side.

The control apparatus 100 may determine the quality of the light-emitting element based on the fluorescence image having the original emission wavelength, and determine the quality based on the fluorescence image on the long wavelength side for a light-emitting element determined to be defective in the determination after the determination. According to such a configuration, for example, even when a light-emitting element is determined to be defective based on the light emission state in the normal fluorescence spectrum, if the light-emitting element has no abnormality (fluorescence spot) on the long wavelength side, the light-emitting element can be determined to be non-defective, and it is possible to prevent a light-emitting element not having a serious abnormality (fluorescence spot on the long wavelength side) from being determined to be defective. Further, since the quality determination based on the fluorescence image on the long wavelength side is performed only for a light-emitting element determined to be defective in the quality determination based on the fluorescence image having the original emission wavelength, it is possible to shorten a time required for determination related to an abnormality on the long wavelength side.

The control apparatus 100 determines the quality of the light-emitting element based on the luminance of the fluorescence image having the original emission wavelength, and determines the quality of the light-emitting element based on the bright spot included in the fluorescence image on the long wavelength side. According to such a configuration, the quality of the light-emitting element can be determined with higher accuracy in consideration of the luminance of the fluorescence in the normal fluorescence spectrum and information about the fluorescence spot on the long wavelength side (presence or absence and the number of abnormal fluorescence spots, etc.).

The control apparatus 100 outputs a quality determination result for each light-emitting element. In this way, it is possible to identify a light-emitting element that affects the light emission efficiency and take measures to improve the light emission efficiency by using the quality determination result for each light-emitting element.

The control apparatus 100 identifies a defective portion in the light-emitting element, and outputs a position of the defective portion. For example, when a position of a fluorescence spot on the long wavelength side in the light-emitting element is identified based on an imaging result, and the position of the fluorescence spot is output as a defective portion, it is possible to take measures to improve the light emission efficiency based on information about the defective portion.

Even though the embodiment of the invention has been described above, the invention is not limited to the embodiment. For example, even though the first wavelength and the second wavelength have been described as being the same wavelength (reference wavelength BW), the wavelengths are not limited thereto and may be different from each other.

Figure 7:
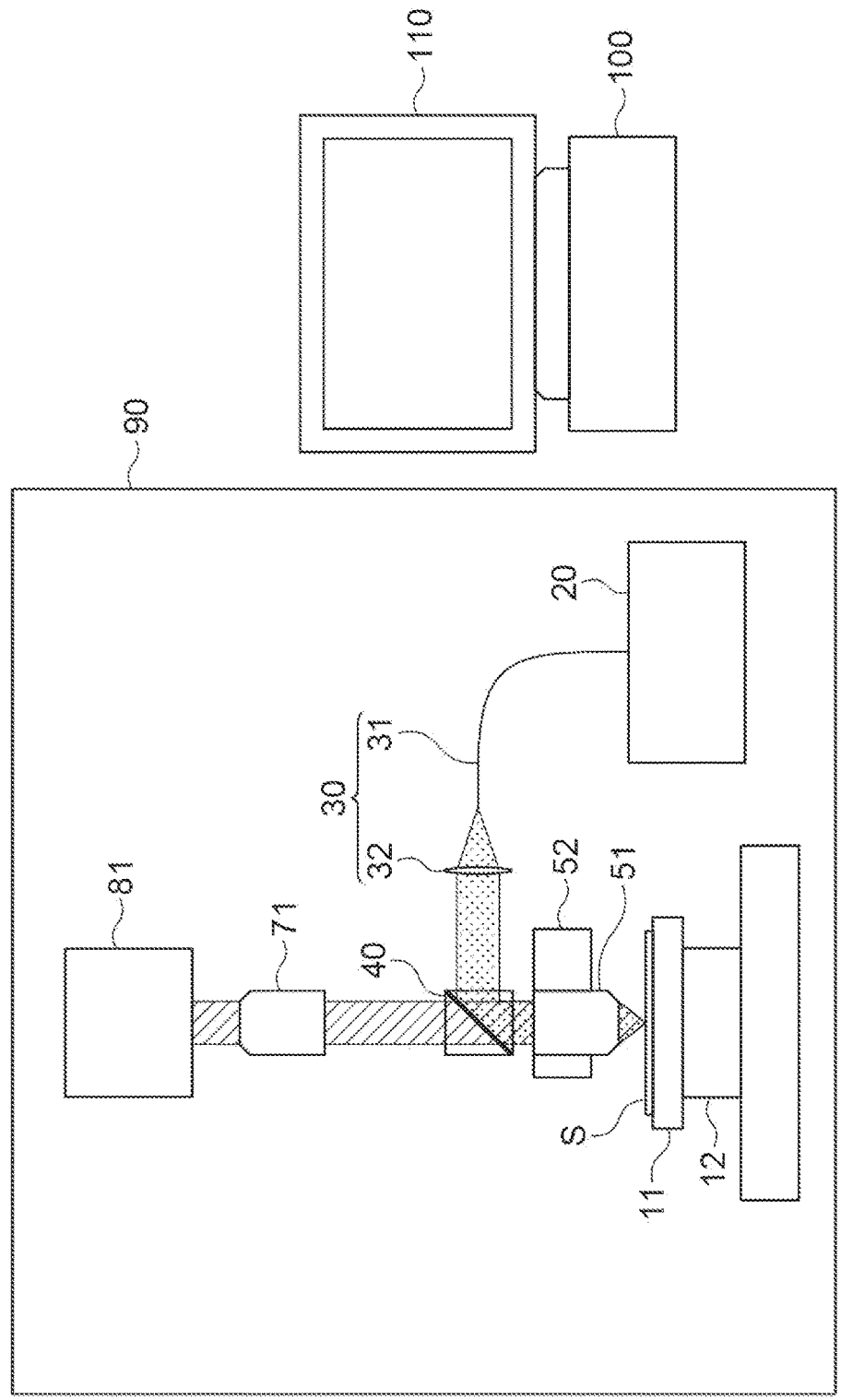
FIG. 7 is a configuration diagram of an inspection apparatus according to a modification.

Further, a description has been given on the assumption that the quality of the light-emitting element is determined based on the fluorescence on the long wavelength side and the fluorescence having the original emission wavelength. However, the invention is not limited thereto, and the control apparatus 100 (determining unit) may determine the quality of the light-emitting element based only on the fluorescence on the long wavelength side imaged by the camera 81. In this case, as illustrated in FIG. 7, it is sufficient that an inspection apparatus 1A has one camera 81 and an imaging lens 71 corresponding to the camera 81, and the inspection apparatus 1A may not have a configuration for acquiring the fluorescence having the original emission wavelength (the dichroic mirror 60, the camera 82, and the imaging lens 72 illustrated in FIG. 1).

Further, in the quality determination for the light-emitting element based on the fluorescence on the long wavelength side, a description has been given on the assumption that it is determined whether or not the fluorescence image contains a certain number or more of bright spots. However, the invention is not limited thereto, and the quality of the light-emitting element may be determined simply depending on whether or not the fluorescence image contains one or more bright spots.

Further, in the above-described embodiment, a description has been given using a dichroic mirror having a steep change in transmittance (reflectance) with respect to a wavelength as the dichroic mirror 60 as shown in FIG. 2. However, the invention is not limited to using a dichroic mirror having such a characteristic. For example, it is possible to use a dichroic mirror in which the transmittance (reflectance) with respect to the wavelength gradually changes with a width of about 100 nm. In such a dichroic mirror, the transmittance (reflectance) of the fluorescence changes according to the change in wavelength in a specific wavelength band, and the transmittance (reflectance) of the fluorescence is constant regardless of the change in wavelength in a wavelength band other than the specific wavelength band (lower wavelength side of the specific wavelength band and higher wavelength side of the specific wavelength band). When the width of the wavelength band in which the transmittance (reflectance) of the fluorescence changes according to the change in wavelength is defined as an "edge shift width", for example, the edge shift width of such a dichroic mirror may be made wider than the full width at half maximum of the normal fluorescence spectrum of the light-emitting element.

REFERENCE SIGNS LIST

1, 1A: inspection apparatus, 20: excitation light source, 60: dichroic mirror (optical element), 81: camera (first imaging unit), 82: camera (second imaging unit), 100: control apparatus (determining unit).

The invention claimed is:

1. An inspection apparatus for inspecting an object on which a plurality of light-emitting elements is formed, the inspection apparatus comprising:
    an excitation light source configured to generate excitation light to irradiate the object;
    a first imager configured to image fluorescence having a wavelength longer than a first wavelength in fluorescence from the plurality of light-emitting elements;
    a determining processor configured to determine a quality of each of the plurality of light-emitting elements based on a first fluorescence image acquired by the first imager;
    an optical element configured to separate fluorescence from the plurality of light-emitting elements into fluorescence having a wavelength longer than the first wavelength and fluorescence having a wavelength shorter than a second wavelength; and
    a second imager configured to image fluorescence having a wavelength shorter than the second wavelength, the fluorescence having a wavelength comprised in a normal fluorescence spectrum of the plurality of light-emitting elements,
    wherein the first wavelength is defined as a wavelength equal to a peak wavelength of a normal fluorescence spectrum of the plurality of light-emitting elements plus a full width at half maximum of the normal fluorescence spectrum.

2. The inspection apparatus according to claim 1, wherein the first wavelength and the second wavelength are the same wavelength, and
    the optical element is a dichroic mirror.

3. The inspection apparatus according to claim 1, wherein the determining processor determines a quality of each of the plurality of light-emitting elements based on the first fluorescence image and a second fluorescence image acquired by the second imager.

4. The inspection apparatus according to claim 3, wherein the determining processor determines a quality of each of the plurality of light-emitting elements based on the second fluorescence image, and subsequently determines a quality based on the first fluorescence image for a light-emitting element of the plurality of light-emitting elements determined to be non-defective.

5. The inspection apparatus according to claim 3, wherein the determining processor determines a quality of each of the plurality of light-emitting elements based on the second fluorescence image, and subsequently determines a quality based on the first fluorescence image for a light-emitting element of the plurality of light-emitting elements determined to be defective.

6. The inspection apparatus according to claim 3, wherein the determining processor determines a quality of each of the plurality of light-emitting elements based on a luminance of the second fluorescence image, and determines a quality of each of the plurality of light-emitting elements based on a bright spot contained in the first fluorescence image.

7. The inspection apparatus according to claim 1, wherein the determining processor outputs a quality determination result of each of the plurality of light-emitting elements.

8. The inspection apparatus according to claim 1, wherein the determining processor identifies a defective portion in the plurality of light-emitting elements, and outputs a position of the defective portion in the plurality of light-emitting elements.

9. An inspection method of inspecting an object on which a plurality of light-emitting elements is formed, the inspection method comprising:
    irradiating the object with excitation light;
    imaging fluorescence having a wavelength longer than a first wavelength in fluorescence from the plurality of light-emitting elements; and
    determining a quality of each of the plurality of light-emitting elements based on a first fluorescence image acquired in the imaging,
    wherein the first wavelength is defined as a wavelength equal to a peak wavelength of a normal fluorescence spectrum of the plurality of light-emitting elements plus a full width at half maximum of the normal fluorescence spectrum.

10. The inspection method according to claim 9, further comprising:
    separating fluorescence from the plurality of light-emitting elements into fluorescence having a wavelength longer than the first wavelength and fluorescence having a wavelength shorter than a second wavelength; and
    imaging fluorescence having a wavelength shorter than the second wavelength, the fluorescence having a wavelength comprised in a normal fluorescence spectrum of the plurality of light-emitting elements.

11. The inspection method according to claim 10, wherein the first wavelength and the second wavelength are the same wavelength.

12. The inspection method according to claim 10, wherein a quality of each of the plurality of light-emitting elements is determined based on the first fluorescence image and a second fluorescence image acquired in the imaging fluorescence having the wavelength shorter than the second wavelength.

13. The inspection method according to claim 12, a quality of each of the plurality of light-emitting elements is determined based on the second fluorescence image, and a quality is subsequently determined based on the first fluorescence image for a light-emitting element of the plurality of light-emitting elements determined to be non-defective.

14. The inspection method according to claim 12, a quality of each of the plurality of light-emitting elements is determined based on the second fluorescence image, and a quality is subsequently determined based on the first fluorescence image for a light-emitting element of the plurality of light-emitting elements determined to be defective.

15. The inspection method according to claim 12, wherein a quality of each of the plurality of light-emitting elements is determined based on a luminance of the second fluorescence image, and a quality of each of the plurality of light-emitting elements is determined based on a bright spot contained in the first fluorescence image.

16. The inspection method according to claim 9, wherein a quality determination result of each of the plurality of light-emitting elements is output.

17. The inspection method according to claim 9, wherein a defective portion in the plurality of light-emitting elements is identified, and a position of the defective portion in the plurality of light-emitting elements is output.

* * * * *